United States Patent [19]

Kobayashi et al.

[11] Patent Number: 4,821,148

[45] Date of Patent: Apr. 11, 1989

[54] RESIN PACKAGED SEMICONDUCTOR DEVICE HAVING A PROTECTIVE LAYER MADE OF A METAL-ORGANIC MATTER COMPOUND

[75] Inventors: Shiro Kobayashi; Masahiko Itoh; Akira Minato, all of Hitachi, Japan

[73] Assignee: Hitachi, Ltd., Tokyo, Japan

[21] Appl. No.: 870,399

[22] Filed: Jun. 4, 1986

[30] Foreign Application Priority Data

Jun. 14, 1985 [JP] Japan .................. 60-128068

[51] Int. Cl.$^4$ .................. H01L 23/30; H01L 21/56
[52] U.S. Cl. .................. 361/392; 357/72; 174/52.2; 427/96; 437/211
[58] Field of Search .................. 428/76, 695, 900; 427/96, 131; 174/52 PE; 361/386, 388, 392; 357/72; 437/209, 211

[56] References Cited

U.S. PATENT DOCUMENTS

| | | | |
|---|---|---|---|
| 4,248,920 | 2/1981 | Yoshizumi et al. | 428/76 |
| 4,315,052 | 2/1982 | Horigome et al. | 428/900 X |
| 4,327,369 | 4/1982 | Kaplan | 357/72 |
| 4,373,656 | 2/1983 | Parker, Jr. et al. | 427/96 X |
| 4,425,404 | 1/1984 | Suzuki et al. | 428/900 X |
| 4,480,009 | 10/1984 | Berger | 357/72 X |
| 4,517,238 | 5/1985 | Mine et al. | 428/212 |
| 4,572,853 | 2/1986 | Ikeya et al. | 428/76 |
| 4,617,584 | 10/1986 | Ikeya et al. | 357/72 |

FOREIGN PATENT DOCUMENTS 0076856 4/1983 European Pat. Off. .

OTHER PUBLICATIONS

Chemical Abstracts, vol. 102, no. 18, 8th, Jan., 1985, p. 268, abstract no. 153568r, Columbus, Ohio, US; & JP-A-60 02 681 (Murata Mfg. Co., Ltd) 08-01-1985.
Chemical Abstracts, vol. 103, no. 18, 23rd, Apr., 1985, p. 79, abstract no. 143482q, Columbus, Ohio, US; & CA-A-1185-845 (Westinghouse Electric Corp.) 23-0-4-1985.
Chemical Abstracts, vol. 82, no. 20, 2nd, Aug., 1975, p. 17, abstract no. 125830v, Columbus Ohio, US; & JP-A-74 80 184 (Tokyo Shibaura Electric Co., Ltd) 02-08-1974.
Patent Abstracts of Japan, vol. 6, No. 147 (E-123) [1025], 6th, Aug., 1982; & JP-A-57 69 767 (Tokyo Shibaura Denki K.K.) 28-04-1982.
Chemical Abstracts, vol. 102, No. 18, 8th, Jan., 1985, p. 268, abstract no. 153568r, Columbus, Ohio, US; & JP-A-60 02 681 (Murata Mfg. Co., Ltd) 08-01-1985.
Chemical Abstracts, vol. 103, No. 18, 23rd, Apr., 1985, p. 79, abstract no. 143482q, Columbus, Ohio, US; & CA-A-1185-845 (Westinghouse Electric Corp.) 23-0-4-1985.

*Primary Examiner*—A. D. Pellinen
*Assistant Examiner*—H. L. Williams
*Attorney, Agent, or Firm*—Antonelli, Terry & Wands

[57] ABSTRACT

A silver electrode (4) on a lead frame (2) is bonded to an aluminum electrode (5) on a silicon chip (1) with a copper wire (3). The resulting semiconductor device was immersed in a solution of benzotriazole in ethyl alcohol. An Ag-benzotriazole film (6) was formed on the surface of the silver electrode (4) and a Cu-benzotriazole film (7) was formed on the surface of the copper wire (3), while an Al-benzotriazole film (8) was formed on the surface of the aluminum electrode (5). Even if water penetrates into the semiconductor device, the silver electrode (4), the aluminum electrode (5) and the copper wire (3) are effectively protected by the anticorrosive Ag-benzotriazole film (6), Cu-benzotriazole film (7) and Al-benzotriazole film (8) to exhibit excellent damp-proof.

9 Claims, 1 Drawing Sheet

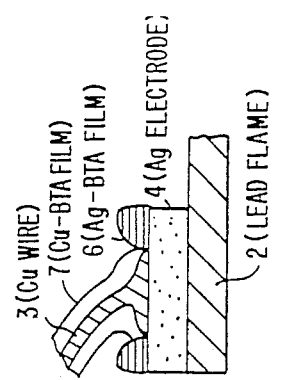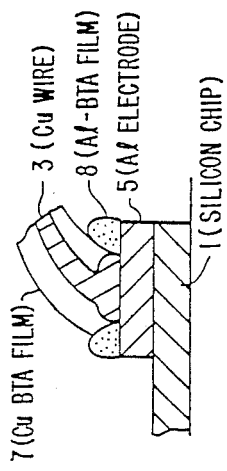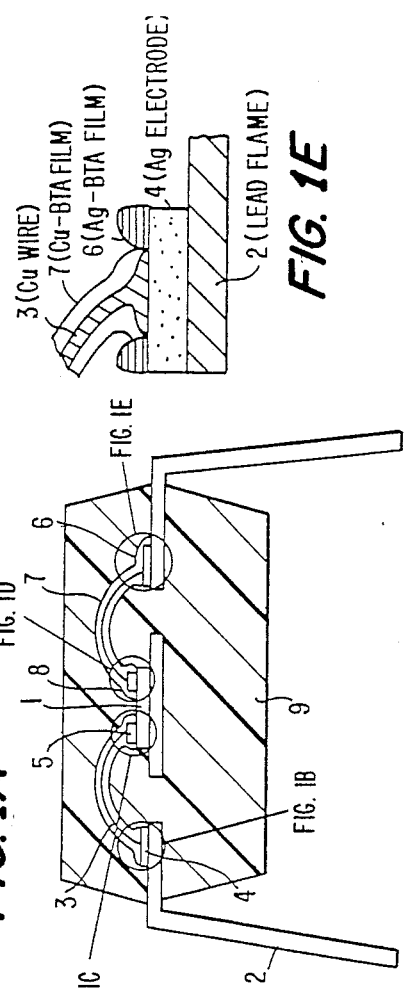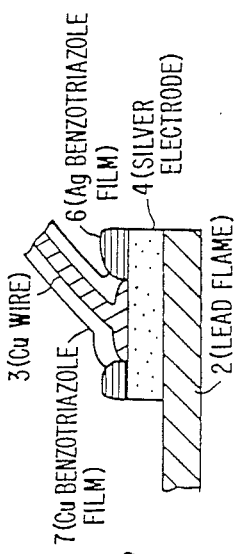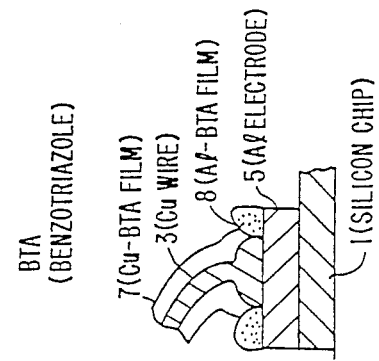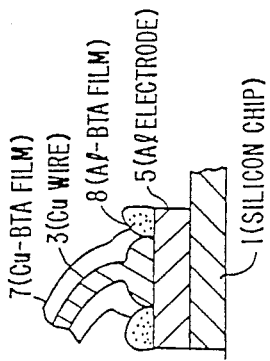

RESIN PACKAGED SEMICONDUCTOR DEVICE HAVING A PROTECTIVE LAYER MADE OF A METAL-ORGANIC MATTER COMPOUND

BACKGROUND OF THE INVENTION 1. (Field of the Invention)

The present invention relates to a resin packaged semiconductor device and more particularly, to a resin packaged semiconductor device which is excellent in damp-proof and corrosion resistance.

2. (Description of the Prior Art)

A semiconductor device such as IC or LSI is generally packaged with various packaging material for the purpose of physical protection against the environment, electrical insulation or the like.

Recently, a resin packaging, which is advantageous in economical efficiency and mass-productivity, is frequently carried out as such packaging material and process. Particularly, transfer packaging with an epoxy resin is mainly employed.

Though packaging with an epoxy resin (hereinafter referred to simply as "resin") is advantageous in economical efficiency and mass-productivity, the package exhibits a poor resistance to moisture permeation, because it is composed of the epoxy resin. Therefore, some problems due to the permeation are brought about.

More precisely, moisture penetrates from the interface between the packaging epoxy resin and the lead frame or permeates through the packaging resin, while dissolving the molding resin component and impurities. Finally it reaches an aluminum metal on the semiconductor chip or an aluminum metallization to form a corrosive liquid film on these parts, thus causing corrosion.

Various methods for controlling such corrosion have been proposed. One of them is a method which comprises forming a protective film on the surface of aluminum metal or aluminum metallization on semiconductor device to thereby control the corrosion.

For example, U.S. Pat. No. 3735484 discloses a method which comprises immersing the part of a semiconductor device to be treated in an aqueous phosphate solution containing anhydrous chromic acid, ammonium fluoride and phosphoric acid to treat the aluminum surface with the phosphate and to form a passivated film on the aluminum surface.

And also Japanese Patent Laid-Open No. 23979/1975 discloses a method which comprises bonding aluminum metal or aluminum metallization to a lead wire and immersing the resulting device in an aqueous solution of phosphoric acid and chromic acid to form a passivated film on the aluminum surface.

According to these methods, a passivated film is formed on the surface of aluminum metal or aluminum metallization to satisfactorily control the corrosion. However, a semiconductor device not always has an aluminum or aluminum alloy surface. That is, a lead frame has sometimes a surface composed of copper, $42N_i\text{-}F_e$ alloy or silver plating, while a lead wire for wire bonding is sometimes made of gold or copper. In such a case, the treatment according to the above method case does not give any passivated film, so that potential difference is generated in this part to form a corrosion cell. Therefore, the corrosion proceeds, which adversely affects the reliability.

Further, as a method of forming a protective film, Japanese Patent Laid-Open No. 116634/1981 discloses a process which comprises exposing a semiconductor device after wire bonding to an atmosphere of high-temperature water vapor to form an oxide layer on the aluminum surface.

And also Japanese Patent Laid-Open No. 50687/1977 discloses a similar method which comprises immersing a semiconductor device in a hot water of 80° to 250° C. for 5 to 100 minutes to form a hydrated oxide layer on the aluminum surface.

These methods are expected to give corrosion-decreasing effect due to the oxide or hydrated oxide layer formed on the aluminum surface. However, as described above, the semiconductor-constituting metal is not always aluminum alone, but also copper, silver, $42N_i\text{-}F_e$ alloy and the like.

Therefore, when such a semiconductor containing a metal other than aluminum is treated according to the above method which comprises exposing a semiconductor to high-temperature water or water vapor, though the semiconductor-constituting materials other than aluminum or its alloy corrode to result in decreased corrosion of aluminum or its alloy, the corrosion of other metals tends to be promoted.

Further, the above methods which use water as an aqueous solution or water vapor are not preferred in terms of control of the corrosion of semiconductor-constituting metals.

Furthermore, for example, Japanese Patent Laid-Open Nos. 115783/1974 and 140476/1976 disclose methods characterized by plating an aluminum metal or aluminum metallization. These methods comprise plating an aluminum metal or aluminum metallization with an anticorrosive metal to thereby protect the aluminum metal or aluminum metallization from a corrosive environment.

However, both electric and chemical plating methods use an aqueous solution, the pH of which is generally on an acid side. Therefore, this plating method has disadvantages in that the semiconductor-constituting metal is somewhat dissolved and that the impurities and anions contained in a plating solution adhere to the aluminum metal or aluminum metallization, so that the aluminum metal or aluminum metallization must be sufficiently washed and dried after plating, thus increasing the number of steps and treatment time.

SUMMARY OF THE INVENTION

An object of the present invention is to provide a resin packaged semiconductor device wherein an excellent damp-proof and corrosion resistance can be obtained.

Another object of the present invention is to provide a resin packaged semiconductor device wherein a high reliability can be obtained.

To attain these objects the inventors of the present invention have studied on the relationship between metal-protective film and water containing corrosive ions which has permeated through a resin, while dissolving or extracting the resin components or impurities, and reached the surface of a semiconductor chip.

As a result of this study, they have found that a semiconductor device which is excellent in damp-proof and corrosion resistance can be obtained by a process which comprises treating a semiconductor device after wire bonding with a non-aqueous solution of an organic compound which chemically reacts with aluminum and copper to form a metal-organic compound which is difficultly soluble in water to form the organic compound on the aluminum and copper and packaging the semiconductor device with a resin.

The water which has permeated through the molding resin and has reached the surface of the wire and element contains various ions such as $Cl^-$, $Br^-$, $Na^+$, $NH_4^+$ or $Sb^{3+}$ which have been extracted during the permeation and has a relatively high electrical conductance solution. Further, the permeating water has a pH on an acid side, i.e., 3.5 to 4.0. Accordingly, the permeating water is highly corrosive because of this low pH and the above contamination by corrosive ions to form a liquid film on the copper wire or aluminum metal (aluminum metallization) which the water reached.

Each of aluminum and copper can be dissolved in a liquid film having a pH of either acid or basic side, because it is an amphoteric metal. As described above the water which has permeated through the resin is acid, so that aluminum or copper is corroded and dissolved. On the other hand, the aluminum or copper is covered with the corrosion product along with the proceeding of the corrosion thereof, thus controlling the proceeding of corrosion.

However, halogen ions such as $Cl^-$ or $B_r^-$ contained in the permeating water has a strong destroying action toward the film of the corrosion product so as to destroy the film formed on the aluminum or copper. Therefore, the dissolution of aluminum or copper begins again.

In other words, the corrosion is a competitive reaction between the formation and destruction of the film of the corrosion product. Consequently, aluminum or copper can be protected from corrosion by forming a stable protective substance on its surface to restrain destruction action.

An organic matter is suitably used for controlling the corrosion of aluminum or copper. Such organic matters are classified into two groups, one of which consists of organic matters which are chemically or physically absorbed on the surface of a metal to thereby control the corrosion and the other of which consists of organic matters which react with a metal to form a metal-organic matter compound, thus controlling the corrosion. The latter compound-forming type is preferred for a semiconductor device.

Preferred examples of the organic matter of compound-forming type are triazoles, among which benzotriazole and tolyltriazole are most preferred. These triazoles are soluble in a non-aqueous solvent such as alcohol. Accordingly, a semiconductor device after wire bonding is immersed in an alcoholic solution of benzotriazole or tolyltriazole having a specified concentration to form a protective film of an Al—benzotriazole compound on the surface of an aluminum metallization.

When a semiconductor device having copper wire bonding is immersed in the same solution as the one used above, a Cu-benzotriazole compound is formed on the surface of the copper wire and bonding parts, while an Al-benzotriazole compound is formed on the aluminum metallization, thus protecting the whole of the semiconductor device from corrosion. The use of tolyltriazole instead of benzotriazole can also give similar effects.

Benzoic acid derivatives such as sodium benzoate are also effective in protecting aluminum or copper from corrosion and a protective film of a metal-benzoic acid derivative compound can be formed in a similar manner as the one described above with respect to the use of benzotriazole. Further, oxalates such as sodium oxalate are also effective for the purpose of the present invention.

Furthermore, azelaic acid ($HOOC(CH_2)_7COOH$), quinaldic acid ($NC_9H_6COOH$), cupferron, rubeanic acid, oxamide and the like are effective in controlling the corrosion of aluminum or copper according to the present invention.

Further, when a semiconductor device is immersed in an alcoholic solution of oxine, the aluminum or copper constituting the semiconductor device is reacted with oxine to form a stable complex compound thereon. Thus, oxine also can control the corrosion of the semiconductor device effectively. Other organic matters which react with aluminum or copper to form a stable compound on the surface thereof can also attain the object of the present invention.

The formation of a metal-organic matter compound is carried out by contacting a semiconductor device after wire bonding with a non-aqueous solution of an organic matter such as benzotriazole. Though the contact may be carried out by any method, for example, spraying, immersing or coating, immersing is simple and sure.

A semiconductor device is immersed in a solution of an organic matter in a non-aqueous solvent such as alcohol to form a metal-organic matter compound thereon and taken out of the solution. The semiconductor device thus treated is dry as such, so that washing or forced drying of the semiconductor device is rarely required.

The metal-organic matter compound formed on the surface of aluminum metallization and copper wire of a semiconductor device after wire bonding is effective in enhancing not only the corrosion resistance but also the adhesion to the molding resin. This is because the roughness of the surface is enhanced by forming a metal-organic matter compound thereon and because the organic matter is compatible with the molding resin. The enhanced adhesion prevents the penetration of water from the outside, i.e., from the interface between the molding resin and the lead frame.

Even if the penetration of water is not completely prevented, the time taken until the water reaches the surface of a semiconductor chip will remarkably be lengthened, which means an enhancement in the reliability of a semiconductor device.

According to the present invention, the penetration of water into a resin packaged semiconductor device can be remarkably reduced and a highly anticorrosive film made of a metal-organic matter compound can be formed on the surface of a semiconductor-constituting metal. Consequently, a semiconductor device which is remarkably excellent in damp-proof and corrosion resistance can be easily obtained.

BRIEF DESCRIPTION OF THE DRAWING

FIG. 1A is a crosssectional view of a semiconductor device according to one embodiment of the present invention.

FIGS. 1B to 1E show enlarged views of the indicated portions of FIG. 1A detailing the protective films and compounds employed.

DETAILED DESCRIPTION OF THE PREFERRED EMBODIMENTS

Experimental cases from which the effect of the protective film-forming agent should be understood will be given. A plate made of 99.99% aluminum, Al—2%Si alloy or copper was subjected to electropolishing to form an experimental sample. This sample was a plate of 25 mm×20 mm×2 mm. Such samples were each immersed in a solution of benzotriazole, tolyltriazole, sodium benzoate, azelaic acid, quinaldlic acid, rubeanic acid or cupferron in ethyl alcohol having various concentration at 40° C. for 3 minutes, taken out and dried.

These treated samples were immersed in the experimental solution ($Cl^-$ 35 ppm, pH 4, 80° C.) containing components extracted by immersing a molding resin in hot water and examined for corrosion resistance according to the AC impedance method. The results are shown in Table 1.

TABLE 1

| | | Protective film-forming agent | Concentration (M/l) | Corrosion resistance (kΩ) | | |
|---|---|---|---|---|---|---|
| | | | | 99.9% Al | Al-2% Si | Cu |
| Ex. | 1 | benzotriazole | 0.16 | 4.5 | 13.5 | 115.3 |
| | 2 | " | 0.08 | 4.5 | 13.5 | 114.6 |
| | 3 | " | 0.02 | 4.0 | 12.7 | 100.2 |
| | 4 | tolyltriazole | 0.16 | 6.8 | 19.6 | 122.2 |
| | 5 | " | 0.08 | 6.8 | 19.6 | 118.9 |
| | 6 | " | 0.02 | 5.9 | 19.0 | 105.4 |
| | 7 | sodium benzoate | 0.50 | 22.3 | 58.5 | 72.1 |
| | 8 | " | 0.10 | 20.4 | 50.3 | 70.3 |
| | 9 | " | 0.01 | 13.2 | 40.1 | 66.5 |
| | 10 | azelaic acid | 0.06 | 5.8 | 18.1 | 34.5 |
| | 11 | " | 0.02 | 5.3 | 17.3 | 31.7 |
| | 12 | " | 0.01 | 4.7 | 14.8 | 30.1 |
| | 13 | quinaldic acid | 0.10 | 7.2 | 20.5 | 40.5 |
| | 14 | " | 0.06 | 5.9 | 18.3 | 37.3 |
| | 15 | " | 0.02 | 3.4 | 16.2 | 35.7 |
| | 16 | rubeanic acid | 0.05 | 8.4 | 25.3 | 35.5 |
| | 17 | " | 0.01 | 6.2 | 24.1 | 34.1 |
| | 18 | " | 0.003 | 4.5 | 20.5 | 32.9 |
| | 19 | cupferron | 0.1 | 23.5 | 63.2 | 75.4 |
| | 20 | " | 0.05 | 20.7 | 60.6 | 70.3 |
| | 21 | " | 0.01 | 18.1 | 54.5 | 68.7 |
| Comp. Ex. | 22 | non-treated | — | 2.0 | 6.0 | 15.0 |

It should be understood from the results that the samples on which the Al-organic matter compounds and the Cu-organic matter compounds were formed have remarkably enhanced corrosion resistance as compared with the non-treated aluminum (99.9%), Al-2%Si or copper to result in less corrosion.

EXAMPLE

An example of the present invention will be described. The accompanying drawings shows an example of a resin packaged semiconductor device of copper-wire bonding type according to the present invention.

A silicon chip 1 was mounted on a lead frame 2. A silver electrode 4 on the lead frame 2 was bonded to an aluminum electrode 5 on the silicon chip 1 with a copper wire 3. The resulting semiconductor device was immersed in a solution of benzotriazole in ethyl alcohol having a concentration of 0.16 M/l at 40° C. for 3 minutes to form a metal-organic matter compound thereon. The treated semiconductor device was taken out of the solution and dried.

An Ag-benzotriazole film 6 was formed on the surface of the silver electrode 4 of the lead frame 2, as shown in FIGS. 1A, 1B and 1E, and a Cu-benzotriazole film 7 was formed on the surface of the copper wire 3, as shown in FIGS. 1A to 1E, while an Al-benzotriazole film 8 was formed on the surface of the aluminum electrode 5, as shown in FIGS. 1A, 1C and 1D, of the silicon chip 1. The obtained semiconductor device was packaged with a molding resin 9.

Even if water penetrates into the semiconductor device from the interface between the lead frame 2 and the molding resin 9, the silver electrode 4, the aluminum electrode 5 and the copper wire 3 will be effectively protected by the anti-corrosive Ag-benzotriazole film 6, Cu-benzotriazole film 7 and Al-benzotriazole film 8 to exhibit excellent damp-proof. Further, the adhesion between the Cu-benzotriazole film 7 and the molding resin 9 is enhanced to prevent the penetration of water into the silicon chip 1.

The above resin packaged semiconductor device according to the one embodiment of the present invention and a non-treated resin packaged semiconductor device of copper wire bonding type according to the prior art were examined for the time taken until the burnout due to the corrosion of electrodes or wires occurs according to a pressure-cracker test at 120° C.

Although the time with respect to the resin packaged semiconductor device of the prior art was 400 hours, the resin packaged semiconductor device of the present invention did not burn out even after 2000 hours. It should be understood from this result that a resin packaged semiconductor device which is highly reliable and has sufficiently excellent corrosion resistance can be obtained according to the example of the present invention.

We claim:

1. A resin packaged semiconductor device having at least one protective layer formed on a semiconductor element mounted on a lead frame and metal surfaces of electric connecting metal parts and a resin package covering said at least one protective layer and said semiconductor element, said at least one protective layer being made of a metal-organic matter compound which is a reaction product between an organic matter and the metal surfaces of said electric connecting metal parts; said organic matter being a substance which reacts with said metal surfaces to give a compound which is difficultly soluble in water and being selected from the group consisting of a triazole, a sodium benzoate, an azelaic acid, a quinaldic acid, a rubeanic acid and a cupferron; said reaction product being formed by contact of the metal surfaces with a solution of the organic matter in a non-aqueous solvent; and said at least one protective layer acting to protect said electric connecting parts from moisture and to prevent the penetration of moisture into said semiconductor element by adhesion between said electric connecting parts and said resin; said semiconductor device being immersed in a solution of said organic matter in alcohol to form said at least one protective layer.

2. A resin packaged semiconductor device set forth in claim 1 wherein said alcohol is ethyl alcohol.

3. A resin packaged semiconductor device as set forth in claim 2 wherein said organic matter is a triazole.

4. A resin packaged semiconductor device having protective layers formed on a silicon chip mounted on a lead frame and on metal surfaces of a silver electrode on the lead frame, an aluminum electrode on the silicon chip, and a copper wire connecting the silver electrode and the aluminum electrode, and an epoxy resin package covering the silicon chip, lead frame and metal surfaces; said protective layers on said silver electrode, said aluminum electrode and said copper wire being, respectively, made of a silver-organic matter compound, an aluminum-organic matter compound and a copper organic matter compound; said organic matter being a substance which reacts with silver, aluminum and copper to give compounds which are difficultly soluble in water and which is selected from the group consisting of a triazole, a sodium benzoate, an azelaic acid, a quinaldic acid, a rubeanic acid and a cupferron; said protective layers being formed by contact of the metal surfaces with a solution of said organic matter in a non-aqueous solvent and said protective layers acting to protect said silver electrodes, said aluminum electrodes and said copper wire from moisture and to prevent the penetration of moisture into said semiconductor element by adhesion between said silver electrode, said aluminum electrode and said copper wire and said resin; said semiconductor device being immersed in a solution of said organic matter in an alcohol.

5. A resin packaged semiconductor device set forth in claim 4 wherein said alcohol is an ethyl alcohol.

6. A resin packaged semiconductor device as set forth in claim 4 wherein said organic matter is a triazole.

7. A resin packaged semiconductor device as set forth in claim 6 wherein said triazole is a benzotriazole.

8. A resin packaged semiconductor device as set forth in claim 7 wherein the semiconductor device is immersed in a solution of a benzotriazole in ethyl alcohol.

9. A resin packaged semiconductor device as set forth in claim 8 wherein said protective layers are respectively, a silver-benzotriazole film, an aluminum-benzotriazole film, and a copper benzotriazole.

* * * * *